(12) United States Patent
Kashiwagi et al.

(10) Patent No.: US 7,276,562 B2
(45) Date of Patent: Oct. 2, 2007

(54) EPOXY-SILICONE MIXED RESIN COMPOSITION AND LIGHT-EMITTING SEMICONDUCTOR DEVICE

(75) Inventors: Tsutomu Kashiwagi, Gunma-ken (JP); Toshio Shiobara, Gunma-ken (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 328 days.

(21) Appl. No.: 11/116,295

(22) Filed: Apr. 28, 2005

(65) Prior Publication Data

US 2005/0244649 A1 Nov. 3, 2005

(30) Foreign Application Priority Data

Apr. 30, 2004 (JP) ............................. 2004-135357

(51) Int. Cl.
*C08L 83/07* (2006.01)
(52) U.S. Cl. .................................. 525/476; 428/447
(58) Field of Classification Search ................ 525/476; 428/447
See application file for complete search history.

(56) References Cited

U.S. PATENT DOCUMENTS

| | | | |
|---|---|---|---|
| 3,976,877 A * | 8/1976 | Thillays ....................... | 250/551 |
| 4,082,719 A | 4/1978 | Liles et al. | |
| 5,434,199 A * | 7/1995 | Gallagher et al. ........... | 523/400 |
| 5,783,115 A * | 7/1998 | Bilkadi et al. ............... | 252/582 |
| 5,872,194 A * | 2/1999 | Isshiki et al. ................ | 525/476 |
| 6,103,375 A * | 8/2000 | Birnholz et al. ............. | 428/391 |
| 6,348,960 B1 * | 2/2002 | Etori et al. .................. | 349/112 |
| 6,614,172 B2 | 9/2003 | Chiu et al. | |
| 6,806,509 B2 * | 10/2004 | Yoshino et al. .............. | 257/103 |
| 2002/0145152 A1 | 10/2002 | Shimomura | |
| 2002/0190262 A1 | 12/2002 | Nitta et al. | |

FOREIGN PATENT DOCUMENTS

| | | |
|---|---|---|
| JP | 52-107049 | 9/1977 |
| JP | 7-25987 A | 1/1995 |
| JP | 2001-217467 A | 8/2001 |
| JP | 3241338 B2 | 10/2001 |
| JP | 2002-314139 A | 10/2002 |
| JP | 2002-314143 A | 10/2002 |
| JP | 2002-327126 A | 11/2002 |
| JP | 2002-338833 A | 11/2002 |

* cited by examiner

*Primary Examiner*—Margaret G. Moore
(74) *Attorney, Agent, or Firm*—Birch, Stewart, Kolasch & Birch, LLP

(57) ABSTRACT

An epoxy-silicone mixed resin composition to give a transparent cured product which comprises [I] 100 parts by weight of a curable resin composition containing an organosilicon compound and an epoxy resin as essential components, and [II] 0.1 to 50 parts by weight of a silicone elastomer having a refractive index within 10% of that of a cured product of the curable resin composition. It is suitable for use as an encapsulator for light-emitting semiconductors.

9 Claims, 2 Drawing Sheets

EPOXY-SILICONE MIXED RESIN COMPOSITION AND LIGHT-EMITTING SEMICONDUCTOR DEVICE

CROSS-REFERENCE TO RELATED APPLICATION

This non-provisional application claims priority under 35 U.S.C. §119(a) on Patent Application No. 2004-135357 filed in Japan on Apr. 30, 2004, the entire contents of which are hereby incorporated by reference.

TECHNICAL FIELD

The present invention relates to an epoxy-silicone mixed resin composition which is useful as a protective encapsulating material for light-emitting semiconductor devices because of its ability to impart a cured product which is completely free from dust attraction and exhibits low elasticity, good crack resistance, and outstanding adhesion properties. The present invention relates also to a light-emitting semiconductor device in which the light-emitting semiconductor element is encapsulated with the cured product of the epoxy-silicone mixed resin composition.

BACKGROOUND ART

Light-emitting semiconductor devices such as light-emitting diodes (LED) were mostly those of "round lamp type" in which the light-emitting element is placed on a lead electrode and encapsulated in a transparent resin, as shown in FIG. 3. Recently, they are being replaced by those of "surface mount type" as shown in FIGS. 1 and 2 because of their simple mounting process. In FIGS. 1 to 3, there are shown a casing made of a glass fiber-reinforced epoxy resin 1, a light-emitting element 2, lead electrodes 3 and 4, a die bonding material 5, a gold wire 6, and a protective encapsulating material 7.

A resin composition for encapsulating a light-emitting semiconductor element such as LED is required to have a transparent cured product. In the prior arts, the resin composition for this purpose usually comprises an epoxy resin such as bisphenol A epoxy resin or alicyclic epoxy resin and an acid anhydride curing agent, as is disclosed in Japanese Patent Publication No. 3241338 corresponding to JP-A 11-274571 and JP-A 7-25987.

The conventional transparent epoxy resin composition, however, suffers the disadvantages of being poor in moisture resistance due to high water absorption and especially poor in light resistance due to low transmittance for a short wavelength light, or being colored due to light deterioration.

To overcome these disadvantages, there has been proposed a resin for encapsulating a light-emitting element composed of three components: an organic compound having in a molecule at least two carbon-carbon double bonds reactive with SiH groups, a silicon compound having in a molecule at least two SiH groups, and a hydrosilylating catalyst, as is disclosed in JP-A 2002-327126 and JP-A 2002-338833.

Such a resin composition, however, usually gives a silicone-based cured product with a tacky surface if it is so modified as to improve crack resistance. The tacky surface attracts dust and impairs light transmittance.

So, there has been proposed the use of a silicone resin which can impart a high-hardness cured product for encapsulation, as is disclosed in JP-A 2002-314139 corresponding to U.S. Pat. No. 6,614,172 and JP-A 2002-314143 corresponding to US 2002-0145152 A.

The use of such a high-hardness silicone resin, however, would still result in a poor adhesiveness. For a case-type light-emitting semiconductor device in which a light-emitting element is disposed in a ceramic or plastic casing and a silicone resin is filled in the casing, the use of the high-hardness silicone resin would result in peeling off from the ceramic or plastic casing when subjected to thermal shocks at a temperature of from −40° C. to 120° C.

As a substitute for the above-mentioned resin compositions, there has been proposed a molding resin composition comprises an epoxy resin and a silicone resin, as is disclosed in JP-A 52-107049 corresponding to U.S. Pat. No. 4,082,719. This resin composition still has problems with adhesiveness and discoloration.

Moreover, optical crystals of compound semiconductors such as SiC, GaAs, GaP, GaAsP, GaAlAs, InAlGaP, InGaN, and GaN used for light-emitting elements have a high refractive index. If a refractive index of the encapsulating resin is low as in that of a dimethylsilicone resin, the difference in the refractive index between the encapsulating resin and the semiconductor crystal, results in reflection at the interface therebetween, and this reflection reduces luminous efficiency.

For increasing a luminous efficiency, it has also been proposed to attach an anti-reflection film to a light-emitting device, as is discloses in JP-A 2001-217467 corresponding to US 2002-0190262 A.

However, the formation of the anti-reflection film would increase the manufacturing steps and thus the cost.

SUMMARY OF THE INVENTION

It is an object of the present invention to provide an epoxy-silicone mixed resin composition which is suitable for use as an encapsulating material for light-emitting semiconductor devices since it can impart a transparent cured product having little surface tackiness and good adhesiveness, impact resistance, and light transmittance.

As the result of the study for achieving the above-mentioned object, the present inventors have found that a light-emitting semiconductor device excelling in luminous efficiency, crack resistance, and reliability can be obtained when a light-emitting element therein is encapsulated and protected with a cured product of an epoxy-silicone mixed resin composition obtaining by incorporating a curable resin composition comprising an organic silicone compound and an epoxy resin, particularly a curable resin composition comprising three essential components: (A) an organosilicon compound having in a molecule at least one hydroxyl group bonded to a silicon atom, (B) an epoxy resin having in a molecule at least one epoxy group, and (E) an aluminum-based curing catalyst with a silicone elastomer having a refractive index within 10% of that of the cured product of the curable resin composition.

The present invention is based on the finding that the incorporation with the above-mentioned silicone elastomer improves the reliability such as temperature cycle of the epoxy-containing silicone resin composition for which the present inventors had previously filed a U.S. patent application (Ser. No. 10/990,959). The epoxy-containing silicone resin composition comprises the above-mentioned three components (A), (B), and (E) and is capable of giving a cured product having good adhesiveness and no surface tackiness through a hydrosilylating reaction and a reaction between an epoxy group and a silanol group which take place simultaneously.

According to the present invention, when a light-emitting semiconductor element is encapsulated with a cured product of a novel epoxy-silicone mixed resin composition obtained by incorporating the curable resin composition comprising (A') an organosilicon compound having at least one aliphatic unsaturated monovalent hydrocarbon group and at least one hydroxyl group bonded to a silicon atom in a molecule;

(B) an epoxy resin having at least one epoxy group in a molecule;

(C) an organohydrogenpolysiloxane;

(D) a platinum group metal-based catalyst;

(E) an aluminum-based curing catalyst; with (F) a silicone elastomer having a refractive index within 10% of that of the cured product of the curable resin composition and preferably having a penetration of 5 to 200, the resulting epoxy-silicone mixed resin composition undergoes a hydrosilylating reaction and the epoxy resin curing reaction simultaneously to give a cured product for encapsulating the light-emitting semiconductor element. The cured product is free of surface tackiness and has good crack resistance and good adhesiveness. Therefore, the use of the epoxy-silicone mixed resin composition according to the present invention can provide reliable light-emitting semiconductor devices.

Accordingly, the present invention provides an epoxy-silicone mixed resin composition which is cured into a transparent cured product comprising:

[I] 100 parts by weight of a curable resin composition containing an organosilicon compound and an epoxy resin as essential components, and

[II] 0.1 to 50 parts by weight of a silicone elastomer having a refractive index within 10% of that of a cured product of the curable resin composition.

It is desirable that the curable resin composition is composed of the following essential components:

(A) an organosilicon compound having at least one hydroxyl group bonded to a silicon atom in a molecule, (B) an epoxy resin having at least one epoxy group in a molecule, and (E) an aluminum-based curing catalyst.

It is more desirable that the curable resin composition be composed of the following essential components:

(A') an organosilicon compound having at least one aliphatic unsaturated monovalent hydrocarbon group and at least one hydroxyl group bonded to a silicon atom in a molecule, (B) an epoxy resin having at least one epoxy group in a molecule, (C) an organohydrogenpolysiloxane, (D) a platinum group metal-based catalyst, and (E) an aluminum-based curing catalyst.

The present invention also provides an epoxy-silicone mixed resin composition which is cured into a transparent cured product comprising:

(A') 10 to 70% by weight of an organosilicon compound having at least one aliphatic unsaturated monovalent hydrocarbon group and at least one hydroxyl group bonded to a silicon atom in a molecule, (B) 1 to 50% by weight of an epoxy resin having at least one epoxy group in a molecule, (C) 10 to 50% by weight of an organohydrogenpolysiloxane, (D) 0.001 to 0.5% by weight of a platinum group metal-based catalyst in terms of platinum group metal element, (E) 0.001 to 5% by weight of an aluminum-based curing catalyst, (F) 0.1 to 33% by weight of a silicone elastomer, and (G) 0.01 to 5% by weight of an antioxidant, said silicone elastomer having a refractive index within 10% of that of a cured product of a curable resin composition composed of components (A') to (E).

It is desirable that the epoxy resin in the resin composition is a hydrogenated bisphenol A epoxy resin and/or hydrogenated biphenyl epoxy resin.

The present invention is also directed to a light-emitting semiconductor device in which a light-emitting semiconductor element is encapsulated with the transparent cured product of the epoxy-silicone mixed resin composition.

The epoxy-silicone mixed resin composition according to the present invention can be used as an encapsulating material for light-emitting semiconductor devices. The devices encapsulated with the cured product of the inventive composition is little colored by a heat resistance test, and excellent in crack resistance. Thus, light-emitting semiconductor devices having good luminous efficiency, long life, and low power consumption are provided.

DETAILED DESCRIPTION OF THE PREFERRED EMBODIMENTS

Figure 1:
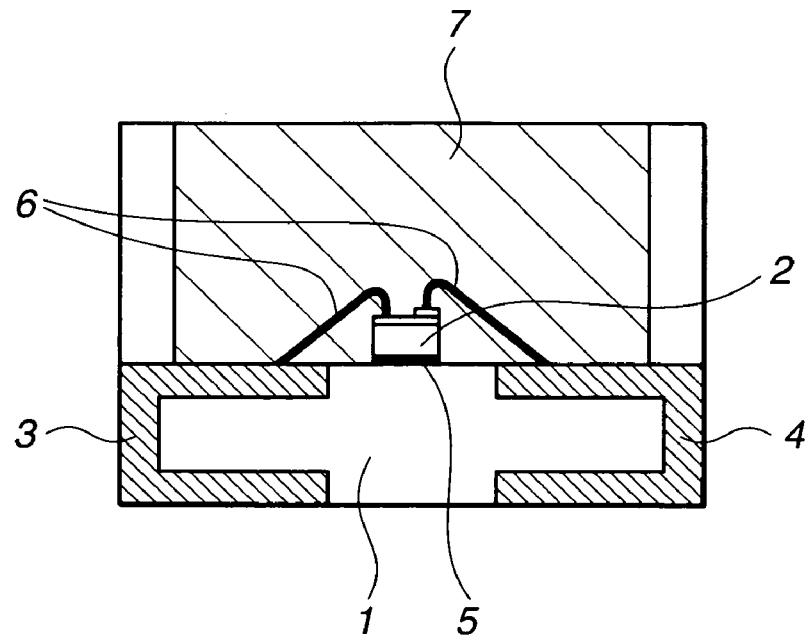
FIG. 1 is a sectional view showing a light-emitting diode as one example of a semiconductor light-emitting device of surface mount type (in which the light-emitting element is die-bonded onto an insulating casing)

The epoxy-silicone mixed resin composition preferably used as an encapsulator for encapsulating a light-emitting semiconductor device according to the present invention comprises:

[I] 100 parts by weight of a curable resin composition containing an organosilicon compound and an epoxy resin as essential components, and

[II] 0.1 to 50 parts by weight of a silicone elastomer having a refractive index within 10% of that of a cured product of the curable resin composition.

It forms a transparent cured product.

It is desirable that the curable resin composition as component [I] comprises the following essential components:

(A) an organosilicon compound having at least one hydroxyl group bonded to the silicon atom in a molecule, (B) an epoxy resin having at least one epoxy group in a molecule, and (E) an aluminum-based curing catalyst.

It is more desirable that the curable resin composition comprises the following essential components:

(A') an organosilicon compound having at least one aliphatic unsaturated monovalent hydrocarbon group and at least one hydroxyl group bonded to a silicon atom in a molecule, (B) an epoxy resin having at least one epoxy group in a molecule, (C) an organohydrogenpolysiloxane, (D) a platinum group metal-based catalyst, (E) an aluminum-based curing catalyst, (F) a silicone elastomer, and (G) an antioxidant, In the present invention, the curable resin composition comprises components (A), (B) and (E), preferably components (A'), (B), (D) and (E).

The epoxy-silicone mixed resin composition is one in which the above curable resin composition is incorporated with a silicone elastomer.

Curable Resin Composition

The component (A) or (A') is an organosilicon compound having in a molecule at least one, usually 1 to 20, preferably at least two, more preferably 2 to 10 silanol groups (hydroxyl groups bonded to silicon atoms). Examples of the organosilicon compounds include organosilanes, organosiloxanes, organosilylalkylenes, and organosilylarylenes. The organosilanes and organosiloxanes may preferably have the following average compositional formula (1).

$$R^1_a R^2_b (HO)_c (R^3O)_d SiO_{(4-a-b-c-d)/2} \quad (1)$$

wherein $R^1$ represents, identical or different, a substituted or unsubstituted monovalent hydrocarbon group having an aliphatic unsaturated bond, $R^2$ represents, identical or different, a substituted or unsubstituted monovalent hydrocarbon group having no aliphatic unsaturated bond, $R^3$ represents, identical or different, a substituted or unsubstituted monovalent hydrocarbon group having no aliphatic unsaturated bond, letter c is a positive number, and letters a, b, and d each are 0 or a positive number, provided that a >0 in case of component (A'), Where component (A) and component (A') are organosilane, letter c is an integer, letters a, b, and d each are 0 or an integer, and a+b+c+d=4. Where component (A) and component (A') are organopolysiloxane, a+b+c+d<4.

Each of $R^1$, $R^2$, and $R^3$ preferably has a carbon number of 1 to 10, more preferably 1 to 6.

More specifically, $R^1$ is exemplified by alkenyl group such as vinyl group, allyl group, propenyl group, isopropenyl group, and butenyl group, acryloxy group, and methacryloxy group. $R^2$ is exemplified by alkyl group such as methyl group, ethyl group, propyl group, butyl group, and cyclohexyl group, aryl group such as phenyl group, and tolyl group, and aralkyl group such as benzyl group. $R^3$ is exemplified by alkyl groups such as methyl group, ethyl group, propyl group, and butyl group and aryl group such as phenyl group.

The hydroxyl group-containing organosilane and organosiloxane are typically exemplified by triphenylsilanol, diphenylmethylsilanol, diphenylsilanediol, tetramethyldihydroxydisilane, and vinyldiphenylsilanediol.

The silanol group-containing organosilane and organosiloxane which further contains a hydrolyzable group such as alkoxyl group can be prepared by complete or partial hydrolysis of a hydrolyzable silane. Typical hydrolyzable silanes include $CH_3(CH_3O)C_6H_5SiOH$, $CH_3(C_2H_5O)$ 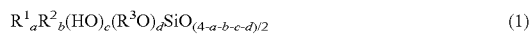 $C_6H_5SiOH$, $(CH_2=CH)(CH_3O)C_6H_5SiOH$, and $C_6H_5(CH_3O)Si(OH)OSi(OH)(CH_3O)C_6H_5$.

The preferred siloxane units of organopolysiloxane include $(CH_3)_2(OH)SiO_{1/2}$, $(CH_3)_2SiO$, $CH_3(C_6H_5)(OH)SiO_{1/2}$, $CH_3SiO_{3/2}$, $CH_3(C_6H_6)SiO$, $C_3H_7(CH_3)SiO$, $SiO_{1/2}$, $(CH_2=CH)(C_6H_5)(OH)SiO_{1/2}$, $C_6H_5(CH_2=CH)(CH_3)SiO_{1/2}$, $(CH_2=CH)(CH_3)SiO$, $C_6H_5(OH)SiO$, $(C_6H_5)_2SiO$, and $C_6H_5(CH_3)SiO_{1/2}$. The organopolysiloxane may also contain a few $SiO_2$ units.

The organopolysiloxane may be easily obtained by hydrolysis of an organochlorosilane corresponding to the siloxane unit and condensation of hydroxyl groups so that necessary hydroxyl groups are left.

In the case where the components (A) and (A') are organopolysiloxane, the letters a, b, c, and d in formula (1) above are defined as follows:

$0 \leq a \leq 0.5$, particularly $0 \leq a \leq 0.2$ (in case of component (A'), $0.001 \leq a \leq 0.5$, particularly $0.01 \leq a \leq 0.2$).

$0 \leq b \leq 2.2$, particularly $0.5 \leq b \leq 2.0$.

$0.001 \leq c \leq 0.5$, particularly $0.01 \leq c \leq 0.2$.

$0 \leq d \leq 0.5$, particularly $0 \leq d \leq 0.2$.

$0.8 \leq a+b+c+d \leq 3$, particularly $1 \leq a+b+c+d \leq 2.5$.

Examples of desirable organopolysiloxanes are those having the structural formulas shown below.

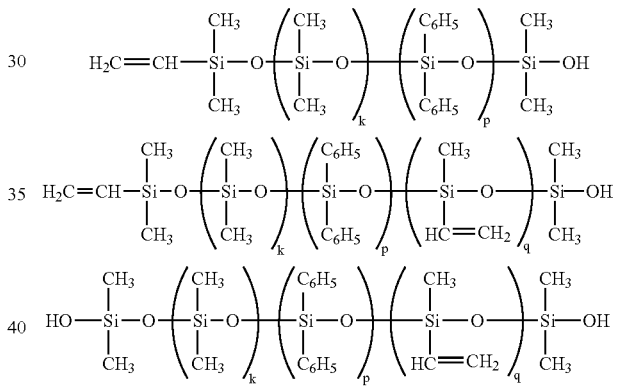

wherein k and p each are a positive number, q is 0 or a positive number, and k+p+q is a number satisfying the viscosity defined below.

In the case where the component (A) or (A') is an organopolysiloxane, particularly a diorganopolysiloxane having a substantially straight chain structure, it should preferably have a viscosity of 10 to 1,000,000 mPa·s, especially 100 to 100,000 mPa·s at 25° C. In the present invention, the value of the viscosity is that measured by a rotary viscometer of BM type.

In the case where the component (A) or (A') is an organopolysiloxane having a branched or three-dimensional network structure containing a trifunctional siloxane unit or tetrafunctional siloxane unit ($SiO_2$), it should preferably have a weight-average molecular weight of about 500 to 100,000, especially about 1,000 to 10,000 (in terms of polystyrene) measured by gel permeation chromatography (GPC).

The organopolysiloxane containing hydroxyl groups bonded to silicon atoms variously takes the form of liquid to solid. In case of the organopolysiloxane having a high degree of polymerization (with a viscosity of at least 1,000 mPa·s or a weight average molecular weight of at least 1,000), the content of hydroxyl groups bonded to silicon atoms preferably is 0.5 to 15% by weight, particularly 1.5 to 10% by weight. With a content less than 0.5% by weight, the organopolysiloxane is poor in reactivity with epoxy groups. With a content more than 15% by weight, the organopolysiloxane is incapable of stable production. Of these organosilicon compounds, the component (A') has at least one, usually 1 to 20, preferably at least two, more preferably 2 to 10 of aliphatic unsaturated hydrocarbon groups such as alkenyl groups.

The component (A) or (A') also includes, in addition to the organosilane and organo(poly)siloxane, silanol group-containing organosilalkylenes and organosilarylenes such as organosilethylene and organosilphenylene and silanol group-containing organosilanes and organosiloxanes having silethylene or silphenylene bonds.

The component (B) is an epoxy resin having on average at least one, preferably at least two epoxy groups (oxyrane rings) in a molecule. Examples of the epoxy resins include bisphenol F epoxy resins, bisphenol A epoxy resins, phenol novolak epoxy resins, cresol novolak epoxy resins, naphthalene epoxy resins, biphenyl epoxy resins, dicyclopentadiene epoxy resins, aralkyl epoxy resins, biphenylaralkyl epoxy resins, hydrogenated epoxy resins obtained by hydrogenating the phenyl group in the above-mentioned epoxy resins, and alicyclic epoxy resins. Any epoxy resin may be used so long as it contains at least one epoxy group in a molecule. Of these, hydrogenated epoxy resins and alicyclic epoxy resins are desirable for protection against deterioration by light. Particularly desirable are hydrogenated epoxy resins obtained by hydrogenating bisphenol A epoxy resins, bisphenol F epoxy resins, or biphenol epoxy resins.

The total content of the epoxy resins in all the organic resins (the sum of components (A) and (B) or the sum of components (A'), (B), and (C)) should be 5 to 80% by weight. With a content less than 5% by weight, the cured product of an epoxy-silicone mixed resin composition would not have a sufficient strength. When a light-emitting semiconductor device is encapsulated with such a composition, resin cracking or incomplete adhesion would occur during a temperature cycle test. With a content more than 80% by weight, the resulting composition contains too much epoxy resins, resulting in the deterioration of the cured product by ultraviolet light when a light-emitting element emits ultraviolet light. The desirable content of the epoxy resins should preferably be 10 to 50% by weight.

The component (C) of an organohydrogenpolysiloxane functions as a crosslinking agent. It has SiH groups to be involved in addition reaction (hydrosilylation) with aliphatic unsaturated monovalent hydrocarbon groups such as vinyl groups in component (A'). This reaction gives rise to a cured product. The organohydrogenpolysiloxane preferably has the following average compositional formula (2).

$$H_m(R^4)_n SiO_{(4-m-n)/2} \qquad (2)$$

wherein $R^4$ represents, identical or different, a substituted or unsubstituted monovalent hydrocarbon group having no aliphatic unsaturated bond, and letters m and n are numbers satisfying $0.001 \leq m \leq 2$, $0.7 \leq n \leq 2$, and $0.8 \leq m+n \leq 3$. The organohydrogenpolysiloxane has hydrogen atoms bonded to silicon atoms (or SiH groups) in a molecule with at least 2, preferably 3 or more, and up to 200, preferably up to 100.

In formula (2), $R^4$ is, identical or different, a substituted or unsubstituted monovalent hydrocarbon group having 1 to 10, especially 1 to 7 carbon atoms and having no aliphatic unsaturated bond. $R^4$ is exemplified by the same groups as explained in the substituent $R^2$ of formula (1), and includes lower alkyl groups such as methyl group and aryl groups such as phenyl group. Letters m and n are numbers satisfying that $0.001 \leq m < 2$, $0.7 \leq n \leq 2$, and $0.8 \leq m+n \leq 3$, preferably $0.05 \leq m < 1$, $0.8 \leq n \leq 2$, and $1 \leq m+n \leq 2.7$. There are no restrictions on the position of a hydrogen atom bonded to a silicon atom. The position may be in the middle or at the end of the molecule.

Examples of the organohydrogenpolysiloxane include methylhydrogenpolysiloxane having both ends blocked with trimethylsilyl groups, dimethylsiloxane-methylhydrogensiloxane copolymer having both ends blocked with trimethylsilyl groups, methylhydrogenpolysiloxane having both ends blocked with dimethylhydrogen silyl groups, dimethylsiloxane-methylhydrogensiloxane copolymer having both ends blocked with dimethylhydrogen silyl groups, tetramethyltetrahydrogen cyclotetrasiloxane, pentamethyltrihydrogen cyclotetrasiloxane, and tri(dimethylhydrogensiloxane) methylsilane.

Another example is a compound represented by the structure formula shown below.

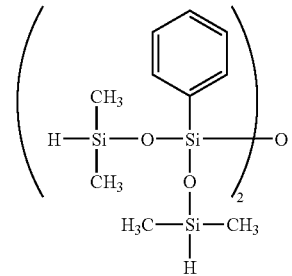

The organohydrogenpolysiloxane may be of straight chain structure, branched chain structure, cyclic structure, or network structure. It can be obtained by hydrolysis of a chlorosilane such as $R^4 SiHCl_2$, $(R^4)_3 SiCl$, $(R^4)_2 SiCl_2$, and $(R^4)_2 SiHCl$ (where $R^4$ is as defined above). Hydrolysis may optionally be followed by a step to subject the siloxane resulting from hydrolysis to equilibrium reaction.

The amount of the organohydrogenpolysiloxane should be an effective amount for curing the component (A'). The amount in terms of SiH groups should be 0.1 to 4.0 mol, preferably 1.0 to 3.0 mol, more preferably 1.2 to 2.8 mol for the total amount of the aliphatic unsaturated group (such as vinyl groups) in the component (A'). A molar ratio less than 0.1 is not enough for the curing reaction, and a cured silicone rubber product will not be obtained. A molar ratio more than 4.0 brings about the problem that a large amount of unreacted SiH groups remain in the cured product, resulting in deteriorating the rubber properties with time.

The component (D) of a platinum group metal-based catalyst is a catalyst for subjecting the composition to addition reaction to cure the composition. The platinum group metal may be platinum, palladium, or rhodium; however, platinum-based ones as exemplified below are desirable costwise.

$H_2PtCl_6 \cdot mH_2O$, $K_2PtCl_6$, $KHPtCl_6 \cdot mH_2O$, $K_2PtCl_4$, $K_2PtCl_4$, $K_2PtCl_4 \cdot mH_2O$, $PtO_2 \cdot mH_2O$, $PtCl_4 \cdot mH_2O$, $PtCl_2$, and $H_2PtCl_4 \cdot mH_2O$ (wherein m is a positive integer). They may form a complex with hydrocarbon, alcohol, or vinyl-containing organopolysiloxane.

The catalyst may be used alone or in combination with one another. The amount of the catalyst is a catalytic amount, preferably in the range of 0.1 to 1,000 ppm, more preferably 1 to 300 ppm in terms of platinum group metal, by weight of the total of the components (A') to (C) mentioned above.

The component (E) is an aluminum-based curing catalyst to polymerize silanol groups and epoxy groups together. To be more specific, the aluminum-based curing catalyst is aluminum hydroxide or an organoaluminum compound selected from the group consisting of aluminum alcoholate, aluminum acylate and its salt, aluminosiloxane compound, and aluminum chelate. The amount of the aluminum-based curing catalyst is a catalytic amount, preferably 0.1 to 10% by weight, more preferably 0.3 to 5% by weight of the amount of the component (A) or the total amount of the components (A') and (B). An amount less than 0.1% by weight is not enough for sufficiently high curing rate. An amount more than 10% by weight will bring about an excessively rapid curing which disables the production of light-emitting semiconductor devices.

The curable resin composition may be incorporated with an adhesive aid as an optional component to improve the adhesiveness of its cured product. Such an adhesive aid may be an organosilicon compound such as an organosilane and an organopolysiloxane each having an alkoxyl group bonded to a silicon atom. Examples of the organosilicon compounds include alkoxysilane compounds such as tetramethoxysilane, tetraethoxysilane, dimethyldimethoxysilane, methylphenyldimethoxysilane, methylphenyldiethoxysilane, phenyltrimethoxysilane, methyltrimethoxysilane, methyltriethoxysilane, vinyltrimethoxysilane, allyltrimethoxysilane, allyltriethoxysilane, 3-glycidoxypropyltrimethoxysilane, and 3-methacryloxypropyltrimethoxysilane, and linear or cyclic siloxane compounds (organosiloxane oligormers) having in a molecule two kinds (preferably two or three kinds) of functional groups bonded to silicon atoms. The functional group is selected from a hydrogen atom bonded to a silicon atom (SiH group), an alkenyl group bonded to a silicon atom (e.g., Si—CH=CH$_2$ group), an alkoxysilyl group (e.g., trialkoxysilyl group such as trimethoxysilyl group), and an epoxy group (e.g., glycidoxyproyl group and 3,4-epoxycyclohexylethyl group).

An adequate adhesion aid is an organosiylyl-modified isocyanurate represented by the following general formula (3) and/or its hydrolysis condensate (organosiloxane-modified isocyanurate compound):

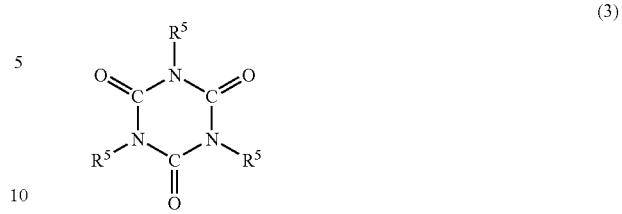

(3)

wherein $R^5$ represents an organic group represented by the following general formula (4) or a monovalent hydrocarbon group having an aliphatic unsaturated bond

(4)

wherein $R^6$ represents a hydrogen atom or a monovalent hydrocarbon group having 1 to 6 carbon atoms, and letter s is an integer of 1 to 6, especially 1 to 4.

Examples of $R^5$ as a monovalent hydrocarbon group having an aliphatic unsaturated bonds include $C_{2-8}$, preferably $C_{2-6}$ alkenyl groups such as vinyl group, allyl group, propenyl group, isopropenyl group, butenyl group, isobutenyl group, pentenyl group, hexenyl group, and cyclohexenyl group. Examples of $R^6$ as a monovalent hydrocarbon group include $C_{1-8}$, preferably $C_{1-6}$ monovalent hydrocarbon groups such as alkyl group (e.g., methyl group, ethyl group, propyl group, isopropyl group, butyl group, isobutyl group, tert-butyl group, pentyl group, hexyl group, cyclohexyl group), alkenyl group (e.g., vinyl group, allyl group, propenyl group, and isopropenyl group), and aryl groups (e.g., phenyl group). Of these, alkyl groups are desirable.

Typical examples of the adhesion aids are listed below.

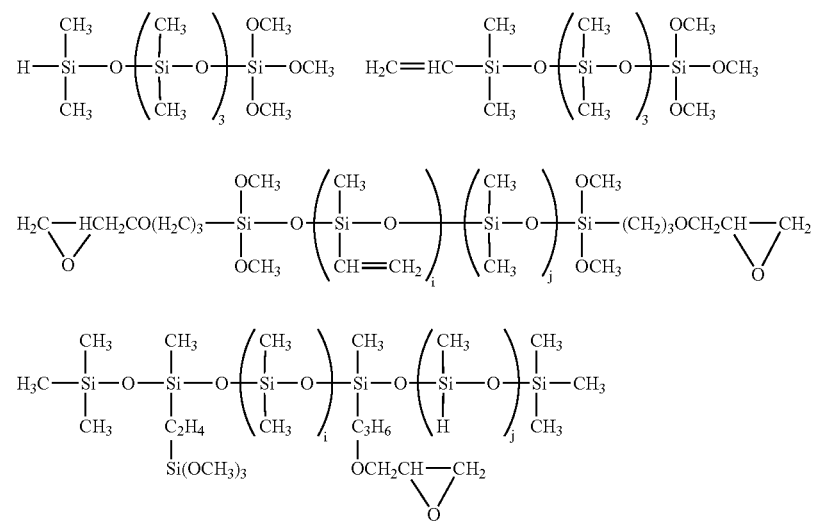

wherein letters i and j are positive integers satisfying that i+j=2 to 50, preferably 4 to 20.

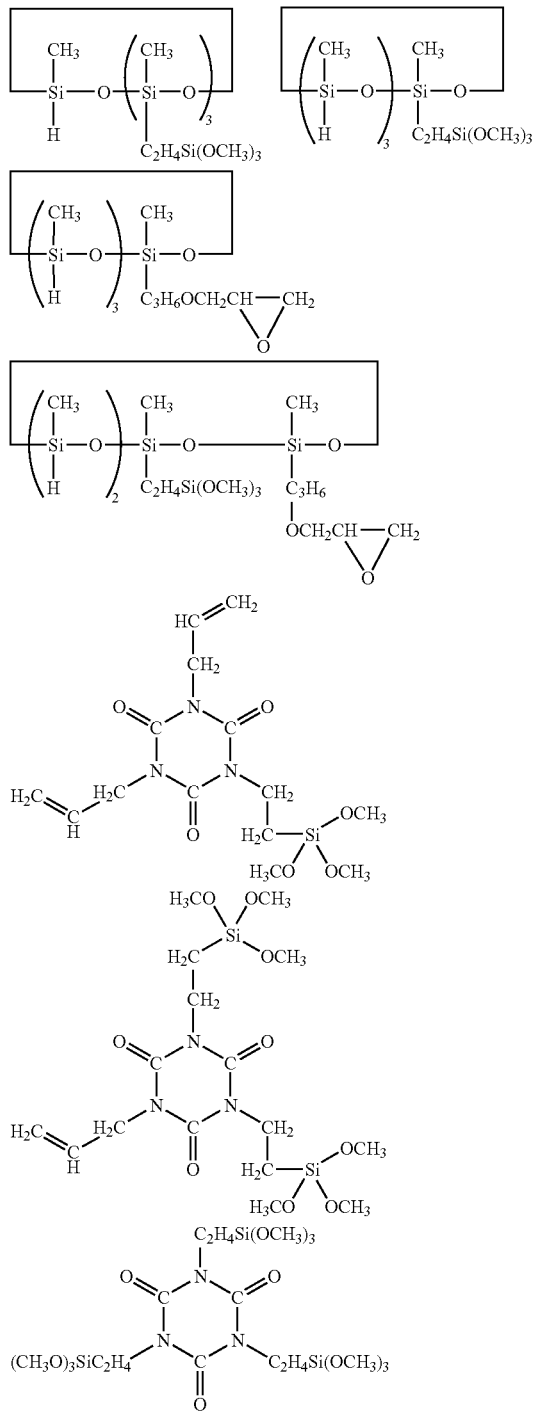

Of the above-mentioned organic silicon compounds, preferred are those having in a molecule an alkoxyl group bonded to a silicon atoms and an alkenyl group or hydrogen atom (SiH group) bonded to a silicon atoms at the same time.

The amount of the above-mentioned adhesion aid (as an optional component) is usually 0 to 10 parts by weight, preferably 0.01 to 5 parts by weight, more preferably 0.1 to 1 part by weight for 100 parts by weight of the amount of component (A) or the total amount of components (A') and (B). With an excessively small amount, the adhesion aid will not fully exert its effect of improving adhesion to the substrate. With an excessively large amount, the adhesion aid will reduce the hardness of a cured product and makes the surface of the cured product tacky.

The curable resin composition comprising the above components has such a high adhesion strength that it does not peel off at the time of curing or device mounting by IR reflow process. The cured product has a hardness of at least 70 (measured by a Durometer type A). The surface of the cured product is free of tackiness and hence does not attract dust. Moreover, the cured product has such a low modulus of elasticity that it absorbs stress due to difference in coefficient of thermal expansion between the cured product and the ceramic or plastic casing. In fact, crack does not occur in the repeated thermal shock tests (1,000 cycles) ranging from −40° C. to 120° C.

The curable resin composition mentioned above, however, does not necessarily pass the severer thermal shock tests ranging from −60° C. to 150° C. depending on the shape of the package. Under such conditions, its cured product is liable to cracking, and there has been a demand for improvement.

Epoxy-Silicone Mixed Resin Composition

According to the present invention, this problem is solved by incorporating the curable resin composition with a cured silicone elastomer having a refractive index within 10% of that of the transparent cured product of the curable resin composition mentioned above, thereby obtaining an epoxy-silicone mixed resin composition.

In this case the epoxy-silicon mixed resin composition of the present invention should preferably be composed of the following essential components.

(A') 10 to 70% by weight of an organosilicon compound having at least one aliphatic unsaturated monovalent hydrocarbon group and at least one hydroxyl group bonded to a silicon atom in a molecule, (B) 1 to 50% by weight of an epoxy resin having at least one epoxy group in a molecule, (C) 10 to 50% by weight of an organohydrogenpolysiloxane, (D) 0.001 to 0.5% by weight of a platinum group metal-based catalyst in terms of platinum group metal element, (E) 0.001 to 5% by weight of an aluminum-based curing catalyst, (F) 0.1 to 33% by weight of a silicone elastomer, and (G) 0.01 to 5% by weight of an antioxidant, the silicone elastomer having a refractive index within 10% of a cured product of a resin mixture composed of components (A') to (E) or curable resin composition.

The cured silicone elastomer used herein should be one which has a refractive index within 10% (or 0 to ±10%, i.e., −10% to +10%), preferably within 5% (or 0 to ±5%, i.e., −5% to +5%) of that of the cured product of the curable resin composition.

The cured silicone elastomer to meet this requirement may preferably be composed of the following essential components:

(i) an organopolysiloxane containing an aliphatic unsaturated group such as vinyl group, (ii) an organohydrogenpolysiloxane, and (iii) platinum group metal-based catalyst.

The organopolysiloxane of component (i) may be the same one as component (A') mentioned above or one which contains in a molecule at least one (preferably two or more) aliphatic unsaturated groups but does not contain silanol groups. Those compounds represented by the following structures are desirable.

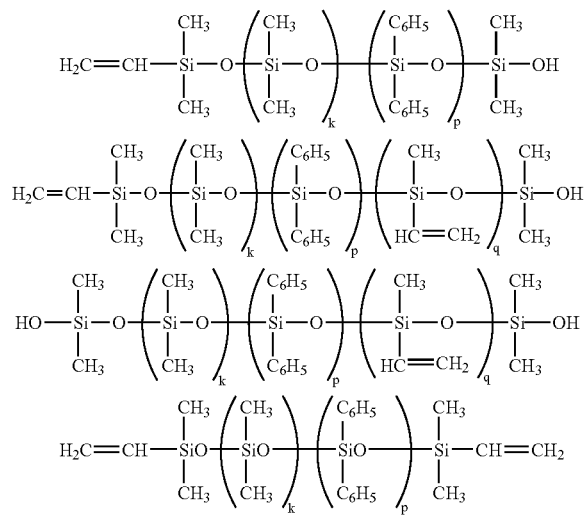

wherein letters k, p and q are as defined above.

The organohydrogenpolysiloxane of component (ii) may be the same one as component (C) mentioned above. The platinum group metal-based catalyst of component (iii) may be the same one as component (E) mentioned above.

The cured silicone elastomer used in the present invention should preferably be a gel-like one. The organohydrogenpolysiloxane is contained in such an amount that the SiH groups account for 0.3 to 1.2 mol, preferably 0.4 to 0.9 mol, more preferably 0.5 to 0.8 mol of the total amount of the aliphatic unsaturated groups such as vinyl groups in the organopolysiloxane of component (i). With a molar ratio smaller than 0.3 or larger than 1.2, the silicone elastomer does not give cured products as desired. The amount of the platinum group metal-based catalyst should be a catalytic amount, and preferably 0.1 to 1,000 ppm, more preferably 1 to 300 ppm in terms of the platinum group metal element per the total amount (by weight) of components (i) and (ii).

The silicone elastomer (or silicone gel) should be one which has a penetration of 5 to 200, particularly 10 to 150, measured in accordance with JIS K2220 (¼ cone) or ASTM D1403 (¼ cone).

The refractive index of the cured silicone elastomer or silicone gel is determined by the ratio of a phenyl group bonded to a silicon atom to an alkyl groups such as methyl groups bonded to a silicone atom. The refractive index of the cured product of the curable resin composition mentioned above is usually 1.4 to 1.6 at 25° C. Therefore, it is necessary to determine the above-mentioned ratio of the phenyl group to the alkyl group. Incidentally, the refractive index tends to increase in proportion to the amount of phenyl groups.

In the present invention, the above-mentioned silicone composition for the silicone elastomer may be cured at room temperature (25° C.) to 200° C. for 5 minutes to 24 hours. The cured silicone elastomer may be evenly mixed with the components for the curable resin composition mentioned above by using a three-roll mixer or the like. The cured silicone elastomer may be dispersed in the form of fine powder when it is adequately cured. The dispersed powder of the cured silicone elastomer should preferably have an average particle diameter of 10 μm or less, preferably 5 μm or less, more preferably 1 μm or less. The lower limit of the average particle diameter is 0.01 μm, particularly 0.1 μm.

The average particle diameter may be measured by laser diffraction method and expressed in terms of weight-average value (or median diameter). If the fine powder of the cured silicone elastomer has an excessively large average diameter, a cured product of the resulting composition may not have sufficient crack resistance. The silicone elastomer in the form of fine particles may behave like a fluid at a high viscosity under some mixing conditions. However, this does not cause any trouble.

The amount of the cured silicone elastomer is generally 0.1 to 50 parts by weight, preferably 1 to 40 pars by weight, more preferably 5 to 40 parts by weight for 100 parts by weight of the curable resin composition containing of the organosilicon compound and epoxy resin as essential components, or the total amount of components (A), (B), and (E), or the total amount of components (A'), (B), (C), (D), and (E). An excessively small amount will adversely affect crack resistance, and an excessively large amount will have an adverse effect on strength and surface tackiness.

The epoxy-silicone mixed resin composition of the present invention should preferably be incorporated with a slight amount of reaction retarder because the inventive composition may slowly cure even at room temperature. The reaction retarder includes acetylene alcohol compounds, triazoles, nitrile compounds, and phosphorus compounds, which extend the working time. Also, the epoxy-silicone mixed resin composition of the present invention may be incorporated with a fluorescent material which alters the wavelength, or a light-scattering agent such as titanium oxide fine powder ($TiO_2$).

In addition, the epoxy-silicone mixed resin composition of the present invention may be incorporated with an antioxidant to improve heat resistance and to prevent discoloration of the cured product. The antioxidant is a compound having a phenolic hydroxyl group, and exemplified by one selected from 2,6-di-t-butyl-4-methylphenol, stearyl-β-propinate, 2,2'-methylenebis(4-ethyl-6-t-butylphenol), and Irganox 1010 (from Ciba Specialty Chemicals). The first and last ones are desirable because of their good compatibility with the resin compound.

The amount of the antioxidant should preferably be 0.1 to 5% by weight. With an amount less than 0.1% by weight, the antioxidant does not fully exert its effect; with an amount more than 5% by weight, the antioxidant will lower the glass transition temperature and adversely affect strength.

The epoxy-silicone mixed resin composition of the present invention may also be incorporated with a reinforcing filler such as fumed silica and precipitated silica, flame retardant, and organic solvent within amounts not harmful to the effect of the present invention. It may also be incorporated with any known color stabilizer such as organophosphorus compound.

The epoxy-silicone mixed resin composition of the present invention may be easily prepared by mixing the components (A), (B), and (E), or the components (A'), (B), (C), (D), (E), and (G) with (F) the cured silicon elastomer, followed by heating.

The epoxy-silicone mixed resin composition comprising components (A'), (B), (C), (D), and (E) can be cured by condensation with the epoxy resin in combination with the hydrosilylating addition reaction. On the other hand, the resin composition comprising components (A), (B), and (E) is cured only by condensation with the epoxy resin. The former is superior to the latter in reliability and adhesiveness to the light-emitting semiconductor elements.

The epoxy-silicone mixed resin composition comprising components (A), (B), (E), and (F), or the epoxy-silicone mixed resin composition comprising components (A'), (B), (C), (D), (E), and (F) should preferably be in the form of liquid when it is used by potting or liquid injection to encapsulate the light-emitting semiconductor devices. It should preferably have a viscosity of 10 to 1,000,000 mPa·s, especially 100 to 1,000,000 mPa·s at 25° C. In the case where the composition is used by transfer molding or CDI molding, it should preferably be used in the form of pellets obtained by thickening the liquid composition to solidify and pelletize it, although it may be used in the form of liquid.

Figure 2:
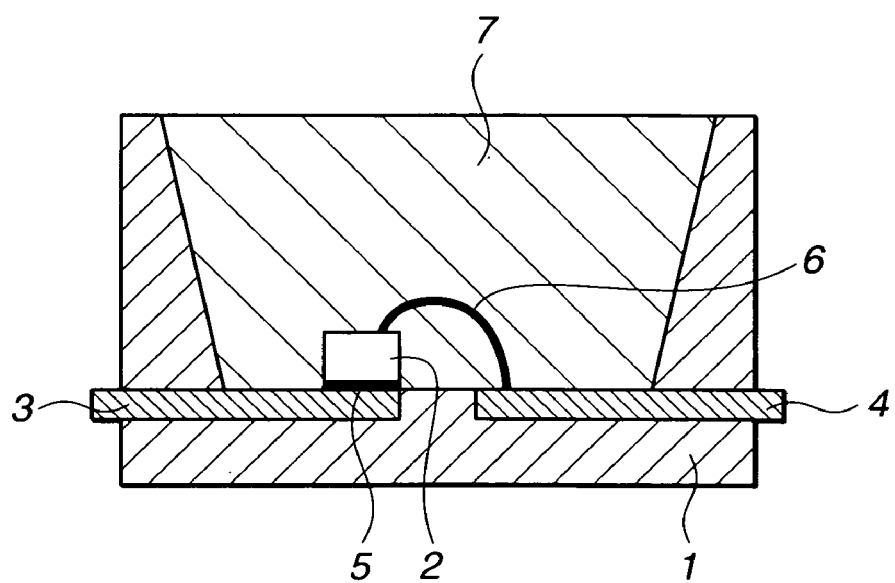
FIG. 2 is a sectional view showing a light-emitting diode as another example of a semiconductor light-emitting device of surface mount type (in which the light-emitting element is die-bonded on lead electrodes inserted into a casing)

The mixed epoxy-silicone resin composition of the present invention is used for encapsulating light-emitting semiconductors such as light-emitting diodes (LED), organic electroluminescent elements (organic EL), laser diodes, and LED arrays. The encapsulation of the light-emitting semiconductor may be accomplished in various ways without specific restrictions. One way, as shown in FIGS. 1 and 2, is by filling the encapsulating material (the epoxy-silicone mixed resin composition) into a casing in which a light-emitting semiconductor is disposed, covering the semiconductor, and curing the composition. Printing, transfer molding, or injection molding may be employed to form an array of LEDs (shown in FIG. 3) arranged on a substrate.

The mixed epoxy-silicone resin composition of the present invention may be cured at room temperature (25° C.) to 200° C. for 3 minutes to 72 hours depending on the working conditions, productivity, and the heat resistance of the light-emitting elements and casing. Transfer molding or injection molding may be accomplished at 150 to 180° C. for 1 to 5 minutes under a pressure of 20 to 50 kgf/cm².

EXAMPLES

The invention will be described in more detail with reference to the following Examples and Comparative Examples, which are not intended to restrict the scope thereof. In the following examples, Me, Ph, and Vi show methyl group, phenyl group, and vinyl group, respectively. Parts shows parts by weight, and viscosity is a value measured at 25° C. by using a rotary viscometer.

Sample preparation and test methods used in the examples are explained.

[Test Method]

Preparation of Silicone-Based Die Bonding Material

A silicone die bonding material was prepared by mixing 100 parts of dimethylsiloxane-diphenylsioxane copolymer having both ends blocked with vinyldimethylsiloxane (with a viscosity of 3 Pa·s) represented by the following formula (I):

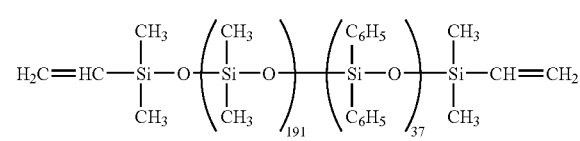

(I)

2.5 parts of methylhydrogenpolysiloxane (with a viscosity of 15 mPa·s) represented by the following formula (II):

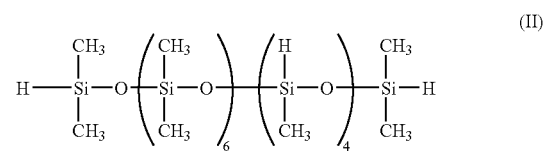

(II)

0.03 parts of chloroplatinic acid 2-ethylhexyl alcohol-modified solution (containing 2% by weight Pt), 0.05 parts of ethynylcyclohexyl alcohol, 7 parts of 3-glycidoxypropyltrimethoxysilane, and 400 parts of spherical alumina fine powder having an average particle diameter of 9 μm.

Preparation of Light-Emitting Semiconductor Device

Figure 3:
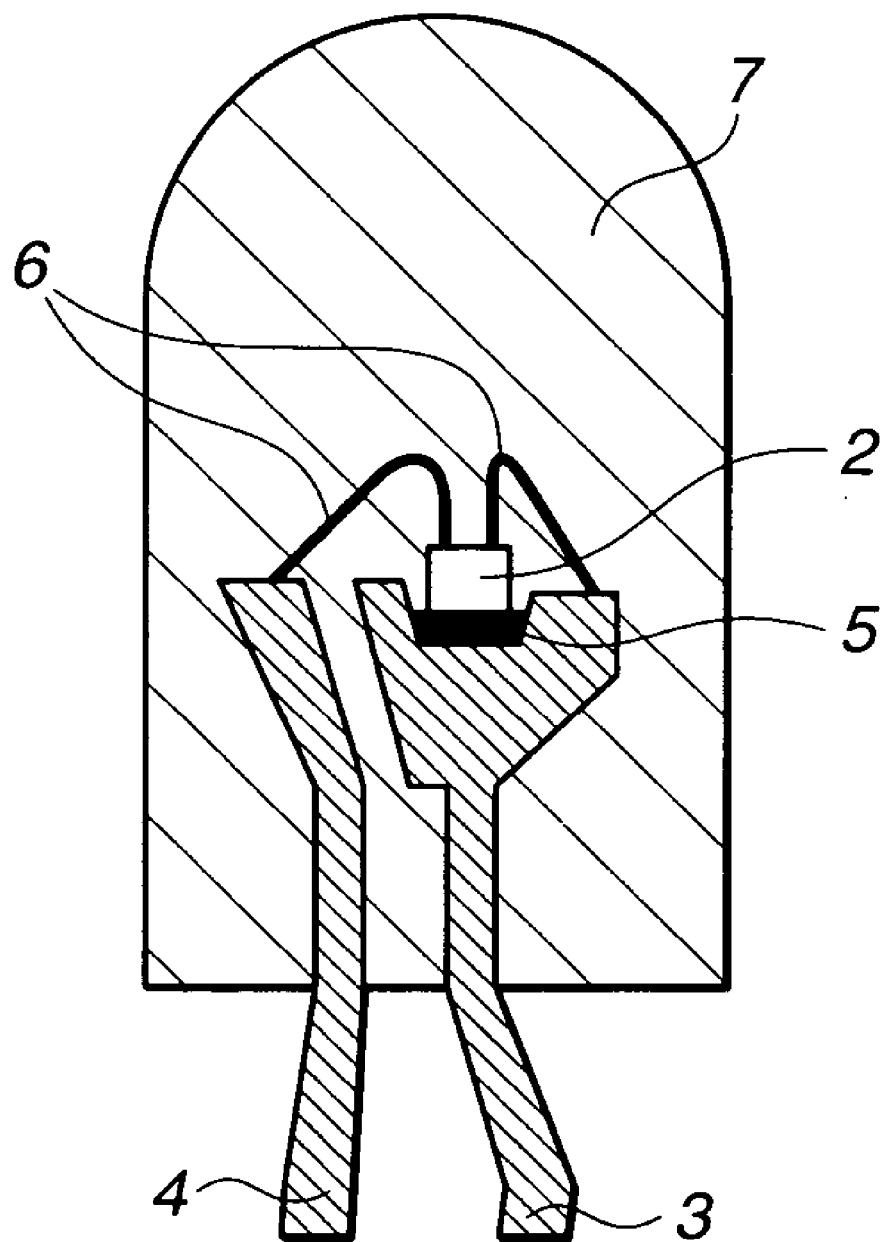
FIG. 3 is a sectional view showing a light-emitting diode as a further example of a semiconductor light-emitting device of round lamp type.

A light-emitting semiconductor device as shown in FIG. 3 was prepared, in which a light-emitting element is an LED chip having a luminescent layer of InGaN and emitting light with a wavelength of 470 nm at the peak intensity. The light-emitting element 2 was fixed to a lead electrode 3 with a silicone-based die bonding material 5 by heating at 180° C. for 10 minutes. The light-emitting element 2 was further connected to lead electrodes 3 and 4 with gold wires 6. The entire assembly was encapsulated with an encapsulating material 7 by potting, followed by curing at 180° C. for 1 hour. Thus there was obtained a light-emitting semiconductor device sample.

Method for Testing Thermal Shock Resistance

The light-emitting semiconductor device sample was examined for cracking on its surface after repeated cooling and heating at −60° C. and 150° C. for 1,000 cycles.

Surface Tackiness

This test was conducted by sprinkling silica fine powder on the light-emitting semiconductor device sample and blowing air to the surface of the semiconductor device sample to examine whether or not the silica fine powder adhered to the surface of the semiconductor device sample is removed.

Change in Light Transmission

A cured specimen (1 mm thick) was tested for light transmission before and after standing for 1,000 hours in an atmosphere at 100° C. Change in light transmission is expressed in terms of the ratio of the last value to the initial value.

Example 1

A curable resin composition which imparts a cured product having a refractive index of 1.51 at room temperature (25° C.) was prepared from the following components:

50 parts of organopolysiloxane represented by the following formula:

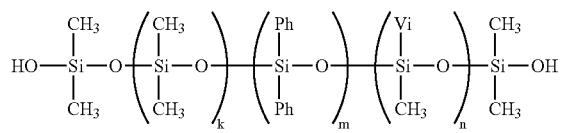

wherein, k=65, m=30, and n=2, 30 parts of organopolysiloxane having a weight-average molecular weight of 2,000 composed of siloxane units represented by $(PhSiO_{3/2})_{0.6}(MeSiO_{3/2})_{0.2}(ViMeSiO_{2/2})_{0.2}$, in which the amount of hydroxyl groups bonded to silicon atoms is 8% by weight;

20 parts of bisphenol A epoxy resin, 5 parts of organohydrogenpolysiloxane represented by the following formula:

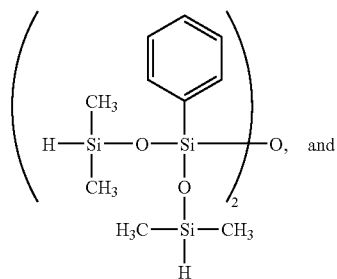

0.3 part of adhesion aid represented by the following formula:

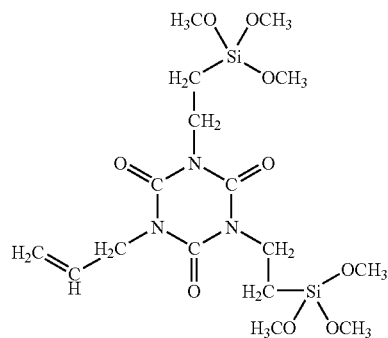

On the other hand, a silicone gel composition was prepared from the following components:

100 parts of vinyl group-containing silicone oil represented by the following formula (a), in which SiVi accounts for 0.059 mol/100 g:

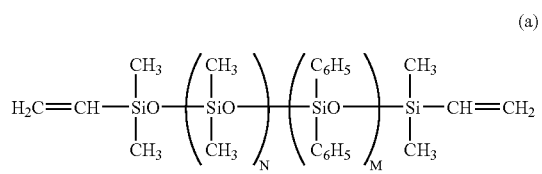

wherein M=9 and N=19 on average, 23 parts of hydroxyl group-containing silicone oil represented by the following formula (b), in which SiH accounts for 0.0017 mol/g:

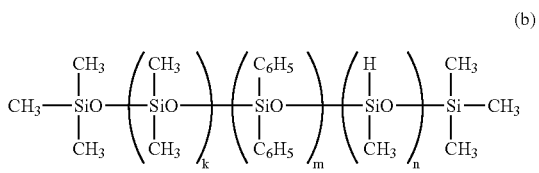

wherein k=8, m=4, and n=3 on average, and 0.02 part of chloroplatinic acid octyl alcohol-modified solution.

The silicone gel composition was cured at 130° C. for two hours to give a cured silicone elastomer having a penetration of 30.

Then, the cured silicone elastomer was mixed by using a three-roll mill with the above-described curable resin composition. In this case, 20 parts of the cured silicone elastomer was used for 100 parts of components (A'), (B) and (C).

100 parts of the resulting mixture was incorporated by thorough stirring with 0.05 part of chloroplatinic acid octyl alcohol-modified solution and 0.1 part of aluminum acetylacetone, thereby obtaining an epoxy-silicone mixed resin composition.

The epoxy-silicone mixed resin composition was cured at 150° C. for four hours to obtain a cured product specimen. The specimen was tested for hardness (Shore D) according to JIS K6301. Upon curing at 150° C. for four hours, the epoxy-silicone mixed resin composition gave a colorless transparent cured product.

This epoxy-silicone mixed resin composition was used to prepare a light-emitting device sample as described above.

Example 2

A curable resin composition was prepared from the following components:

80 parts of organopolysiloxane having a weight-average molecular weight of 2,000 composed of siloxane units represented by $(PhSiO_{3/2})_{0.6}(MeSiO_{3/2})_{0.2}(ViMeSiO_{2/2})_{0.2}$, in which the amount of hydroxyl groups bonded to silicon atoms is 8% by weight, 20 parts of hydrogenated bisphenol A epoxy resin, 5 parts of organohydrogenpolysiloxane represented by the following formula:

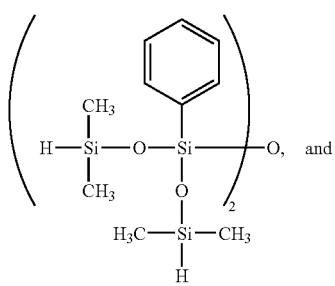

0.3 parts of adhesion aid represented by the following formula:

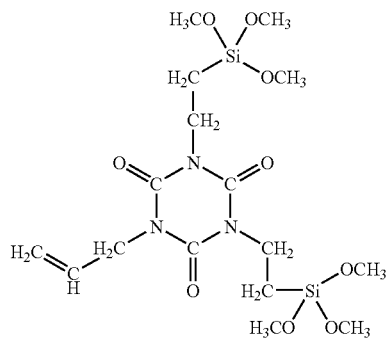

On the other hand, a silicone gel composition was prepared from the following components:

100 parts of vinyl group-containing silicone oil represented by the same formula as in Example 1, in which SiVi accounts for 0.059 mol/100 g, 19.5 parts of hydroxyl group-containing silicone oil represented by the same formula as in Example 1, in which SiH accounts for 0.0017 mol/g, and 0.02 parts of chloroplatinic acid octyl alcohol-modified solution.

The silicone gel composition was cured at 130° C. for two hours to give a cured silicone elastomer having a penetration of 70.

Then, the cured silicone elastomer was mixed by using a three-roll mill with the above-describe curable resin composition. In this case, 20 parts of the cured silicone elastomer was used for 100 parts of components (A'), (B) and (C).

100 parts of the resulting mixture was incorporated by thorough stirring with 0.05 parts of chloroplatinic acid octyl alcohol-modified solution and 0.1 parts of aluminum acetylacetone, thereby obtaining an epoxy-silicone mixed resin composition.

The epoxy-silicone mixed resin composition was cured at 150° C. for four hours to obtain a cured product specimen. The specimen was tested for hardness (Shore D) according to JIS K6301. Upon curing, the epoxy-silicone mixed resin composition gave a colorless transparent cured product.

This epoxy-silicone mixed resin composition was used to prepare a light-emitting device sample as described above.

Example 3

The same procedure as in Example 2 was repeated except that the hydrogenated bisphenol A epoxy resin was replaced by hydrogenated biphenol epoxy resin. The resulting mixed resin composition was cured and the cured product (which was colorless transparent) was tested in the same way as in Example 2. The results are shown in Table 1.

This epoxy-silicone mixed resin composition was used to make a sample of light-emitting device.

Examples 4 to 6 and Comparative Examples 1 and 2

The same procedure as in Example 2 was repeated except that the amount of cured silicone elastomer was changed as shown in Table 1. The resulting mixed resin composition was cured and the cured product (which was colorless transparent) was tested in the same way as in Example 2. The results are shown in Table 1.

This epoxy-silicone mixed resin composition was used to make a sample of light-emitting device.

The resin composition in Examples 1 to 6 and Comparative Examples 1 and 2 were used to encapsulate light-emitting elements, and the encapsulated light-emitting elements were tested for performance. The results are shown in Table 1.

TABLE 1

|  | Example | | | | | | Comparative Example | |
| --- | --- | --- | --- | --- | --- | --- | --- | --- |
|  | 1 | 2 | 3 | 4 | 5 | 6 | 1 | 2 |
| Resin hardness (Shore D) | 55 | 50 | 50 | 60 | 30 | 65 | 80 | 15 |
| Surface tackiness | none | none | none | none | none | none | none | Yes |
| Amount of silicone elastomer [1] | 20 | 20 | 20 | 10 | 40 | 5 | 0 | 70 |
| Thermal shock resistance [2] | 0/50 | 0/50 | 0/50 | 0/50 | 0/50 | 5/50 | 50/50 | 25/50 (crack) |
| Change in light transmittance [3] | 90 | 90 | 90 | 90 | 90 | 85 | 95 | 90 |

Note:
[1] In parts by weight for the total amount (100 parts) of components (A'), (B), and (C).
[2] Ratio of crack occurrence.
[3] Change in terms of percent after standing at 100° C. for 1,000 hours.

Japanese Patent Application No. 2004-135357 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention calimed is:

1. An epoxy-silicone mixed resin composition which is cured into a transparent cured product comprising:
[I] 100 parts by weight of a curable resin composition containing an organosilicon compound and an epoxy resin as essential components, and
[II] 0.1 to 50 parts by weight of a silicone elastomer having a refractive index within 10% of that of a cured product of said curable resin composition.

2. The epoxy-silicone mixed resin composition of claim 1, wherein the curable resin composition comprises:
(A) an organosilicon compound having at least one hydroxyl group bonded to a silicon atom in a molecule, (B) an epoxy resin having at least one epoxy group in a molecule, and
(E) an aluminum-based curing catalyst.

3. The epoxy-silicone mixed resin composition of claim 1, wherein the curable resin composition comprises:
(A') an organosilicon compound having at least one aliphatic unsaturated monovalent hydrocarbon group and at least one hydroxyl group bonded to a silicon atom in a molecule,
(B) an epoxy resin having at least one epoxy group in a molecule,
(C) an organohydrogenpolysiloxane,
(D) a platinum group metal-based catalyst, and
(E) an aluminum-based curing catalyst.

4. An epoxy-silicone mixed resin composition which is cured into a transparent cured product comprising:
(A') 10 to 70% by weight of an organosilicon compound having at least one aliphatic unsaturated monovalent hydrocarbon group and at least one hydroxyl group bonded to a silicon atom in a molecule,
(B) 1 to 50% by weight of an epoxy resin having at least one epoxy group in a molecule,
(C) 10 to 50% by weight of an organohydrogenpolysiloxane,
(D) 0.001 to 0.5% by weight of a platinum group metal-based catalyst in terms of platinum group metal element,
(E) 0.001 to 5% by weight of an aluminum-based curing catalyst,
(F) 0.1 to 33% by weight of a silicone elastomer, and
(G) 0.01 to 5% by weight of an antioxidant,
said silicone elastomer having a refractive index within 10% of that of a cured product of a curable resin composition composed of components (A') to (E).

5. The epoxy-silicone mixed resin composition of claim 1, wherein the silicone elastomer has a penetration of 5 to 200.

6. The epoxy-silicone mixed resin composition of claim 1, wherein the epoxy resin is a hydrogenated bisphenol A epoxy resin and/or hydrogenated biphenyl epoxy resin.

7. A light-emitting semiconductor device in which a light-emitting semiconductor element is encapsulated with the transparent cured product of the epoxy-silicone mixed resin composition of claim 1.

8. A light-emitting semiconductor device in which a light-emitting semiconductor element is encapsulated with the transparent cured product of the epoxy-silicone mixed resin composition of claim 3.

9. A light-emitting semiconductor device in which a light-emitting semiconductor element is encapsulated with the transparent cured product of the epoxy-silicone mixed resin composition of claim 4.

* * * * *